United States Patent
LaFontaine et al.

(10) Patent No.: US 7,952,851 B2
(45) Date of Patent: May 31, 2011

(54) WAFER GROUNDING METHOD FOR ELECTROSTATIC CLAMPS

(75) Inventors: Marvin R. LaFontaine, Kingston, NH (US); Ari Eiriksson, South Hamilton, MA (US); Ashwin M. Purohit, Gloucester, MA (US); William D. Lee, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 174 days.

(21) Appl. No.: 12/262,399

(22) Filed: Oct. 31, 2008

(65) Prior Publication Data

US 2010/0110603 A1     May 6, 2010

(51) Int. Cl.
*H01L 21/683* (2006.01)
(52) U.S. Cl. ............................................. 361/234
(58) Field of Classification Search ................. 361/234
See application file for complete search history.

(56) References Cited

U.S. PATENT DOCUMENTS

| | | | |
|---|---|---|---|
| 2,384,707 A | | 9/1945 | Sweet |
| 5,179,498 A | * | 1/1993 | Hongoh et al. ............... 361/234 |
| 5,625,526 A | * | 4/1997 | Watanabe et al. ............. 361/234 |
| 5,735,855 A | | 4/1998 | Bradley |
| 5,933,747 A | | 8/1999 | Gardner et al. |
| 6,778,258 B2 | | 8/2004 | del Puerto et al. |
| 7,336,471 B2 | | 2/2008 | Suehira et al. |
| 7,338,494 B2 | | 3/2008 | Ryan |
| 2010/0019462 A1 | * | 1/2010 | Chen et al. ................... 279/128 |
| 2010/0103583 A1 | * | 4/2010 | Wang et al. .................. 361/234 |
| 2010/0110604 A1 | | 5/2010 | Smith et al. |

FOREIGN PATENT DOCUMENTS

EP     720217 A2     3/1996

OTHER PUBLICATIONS

"Automatic Center Punch", reprinted from the Internet at http://en.wikpedia.org/wiki/Automatic_center_punch, May 1, 2008, p. 1-2.
Office Action issued Oct. 8, 2010 to U.S. Appl. No. 12/262,990.

* cited by examiner

*Primary Examiner* — Jared J Fureman
*Assistant Examiner* — Terrence R Willoughby
(74) *Attorney, Agent, or Firm* — Eschweiler & Associates, LLC

(57) ABSTRACT

An electrostatic chuck and method for clamping and de-clamping a workpiece is provided. The ESC comprises a clamping plate having a clamping surface, and one or more electrodes. An electric potential applied to the one or more electrodes selectively clamps the workpiece to the clamping surface. An arc pin operably coupled to the clamping plate and a power source provides an arc for penetrating an insulating layer of the workpiece. The arc pin is selectively connected to an electrical ground, wherein upon removal of the insulative layer of the workpiece, the arc pin provides an electrical ground connection to the workpiece.

12 Claims, 4 Drawing Sheets

WAFER GROUNDING METHOD FOR ELECTROSTATIC CLAMPS

FIELD OF THE INVENTION

The present invention relates generally to electrostatic clamping systems and methods, and more specifically to electrostatic chuck having a mechanism for electrically grounding a workpiece.

BACKGROUND OF THE INVENTION

In the semiconductor industry, electrostatic chucks (ESCs) have been utilized in plasma-based or vacuum-based semiconductor processes such as etching, CVD, and ion implantation, etc. for a long time. Capabilities of the ESCs, including non-edge exclusion and wafer temperature control, have proven to be quite valuable in processing workpieces such as semiconductor substrates or wafers, (e.g., silicon wafers). A typical ESC, for example, comprises a dielectric layer positioned over a conductive electrode, wherein the semiconductor wafer is placed on a surface of the ESC (e.g., the wafer is placed on a surface of the dielectric layer). During semiconductor processing, a clamping voltage is typically applied between the wafer and the electrode, wherein the wafer is clamped against the chuck surface by electrostatic forces.

Declamping or un-sticking the wafer from the chuck surface, however, is a concern in many ESC applications. For example, Johnsen-Rahbek (J-R) effect-type ESCs have been developed in order to minimize the de-clamping problem by providing a purposely "leaky" dielectric such that the residual charges can be discharged more quickly. Wafer de-clamping problems in J-R type ESCs, however, can still be present, and are typically caused, at least in part, by charge migrating and accumulating to the backside insulator surface of the wafer. Another problem that can occur is when charge in the wafer builds up from the leakage in a J-R ESC, wherein eventually, the wafer will charge up to substantially the same charge of the ESC. In such an instance, there will be a negligible difference in charge between the ESC and the wafer, and the clamping forces on the wafer will be lost.

Thus, there is a need to provide a low resistance ground path from the wafer in order to provide proper charges in ESCs. Most semiconductor wafers, however, have some kind of oxide, nitride, or other insulative layer that prevents a simple electrical contact being touched to the backside of the wafer. Even wafers that have not yet undergone processing will typically have native oxide formed thereon. Thus, a need exists for a mechanism that is operable to penetrate through the oxide or other insulative layer on the wafer, wherein desired electrical behavior between the ESC and workpiece can be achieved.

SUMMARY OF THE INVENTION

The present invention overcomes the limitations of the prior art by providing an electrostatic chuck having an arc pin for penetrating insulative layers on the backside of a workpiece. The present invention further provides a method for grounding a workpiece via an arc pin. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the invention, an electrostatic chuck for clamping a semiconductor workpiece having an electrically insulating layer formed over a semiconductor substrate is provided, wherein the electrostatic chuck comprises a clamping plate having a clamping surface defined thereon. One or more electrodes are associated with the clamping plate, wherein an electric potential or clamping voltage applied from an electrostatic clamping power source to the one or more electrodes is operable to selectively electrostatically clamp the workpiece to the clamping surface of the clamping plate.

An arc pin is operably coupled to the clamping plate, wherein the arc pin is electrically insulated from the clamping plate, and wherein the arc pin has a tip associated with clamping surface. In one example, the arc pin is electrically insulated from the clamping plate by an electrically insulative housing having a bore extending therethrough, wherein at least a portion of the arc pin generally resides within the bore. The arc pin, for example, slidingly engages the bore, wherein the arc pin is configured to linearly translate between an extended position and a retracted position within the bore. The position of the arc pin, for example, is based, at least in part, on a position (e.g., a clamped or unclamped position) of the workpiece with respect to the clamping surface of the clamping plate. A spring, in one example, generally biases the arc pin against an end of the housing, wherein a tip of the arc pin is generally proud of the clamping surface prior to a workpiece being placed thereon. Alternatively, the arc pin can be fixed with respect to the clamping plate, or selectively moveable with respect to the clamping plate.

According to another exemplary aspect, the electrostatic chuck further comprises a gas source configured to provide a gas between the tip of the arc pin and the workpiece. A translation mechanism is further operably coupled to the arc pin, wherein the translation mechanism is configured to selectively translate the arc pin between the retracted position and the extended position. In the retracted position of the present example, the tip of the arc pin is recessed from the clamping surface, and in the extended position, the arc pin is generally proud of the clamping surface. A controller, for example, can be further configured to control the electrostatic clamping power source, arc pin power source, and translation mechanism, wherein the control of the translation of the arc pin is based, at least in part, on an arc pin voltage from the arc pin power source.

In accordance with another exemplary aspect, the arc pin power source comprises an AC power source configured to provide a square wave arc pin voltage to the arc pin. The square wave arc pin voltage, for example, takes a different waveform than the clamping voltage (e.g., a shorter waveform). In another example, the arc pin is selectively connected to the arc pin power source for breaking through the electrically insulative layer, and then connected to an electrical ground after breakthrough, wherein the workpiece is electrically grounded.

According to another aspect of the invention, a method for electrically grounding a workpiece on an electrostatic chuck is provided. The method, for example, comprises placing the workpiece on a clamping surface of the electrostatic chuck, and electrostatically clamping the workpiece to the clamping surface of the electrostatic chuck. An arc pin voltage is applied to the arc pin, wherein a grounding region of the electrically insulative layer is generally removed by an arcing of the arc pin voltage between the arc pin and the workpiece. Thus, an electrical return path is provided from the workpiece through the arc pin.

In one example, the arc pin voltage to the arc pin is held substantially constant during the electrostatic clamping of the workpiece. In another example, the application of the arc pin voltage is halted once an electrical connection to the semiconductor substrate is attained, wherein an electrical connection from the workpiece to an electrical ground is then attained. In another example, the arc pin voltage is lowered to a maintenance level once an electrical connection to the semiconductor substrate is attained, therein maintaining the electrical return path to the workpiece.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
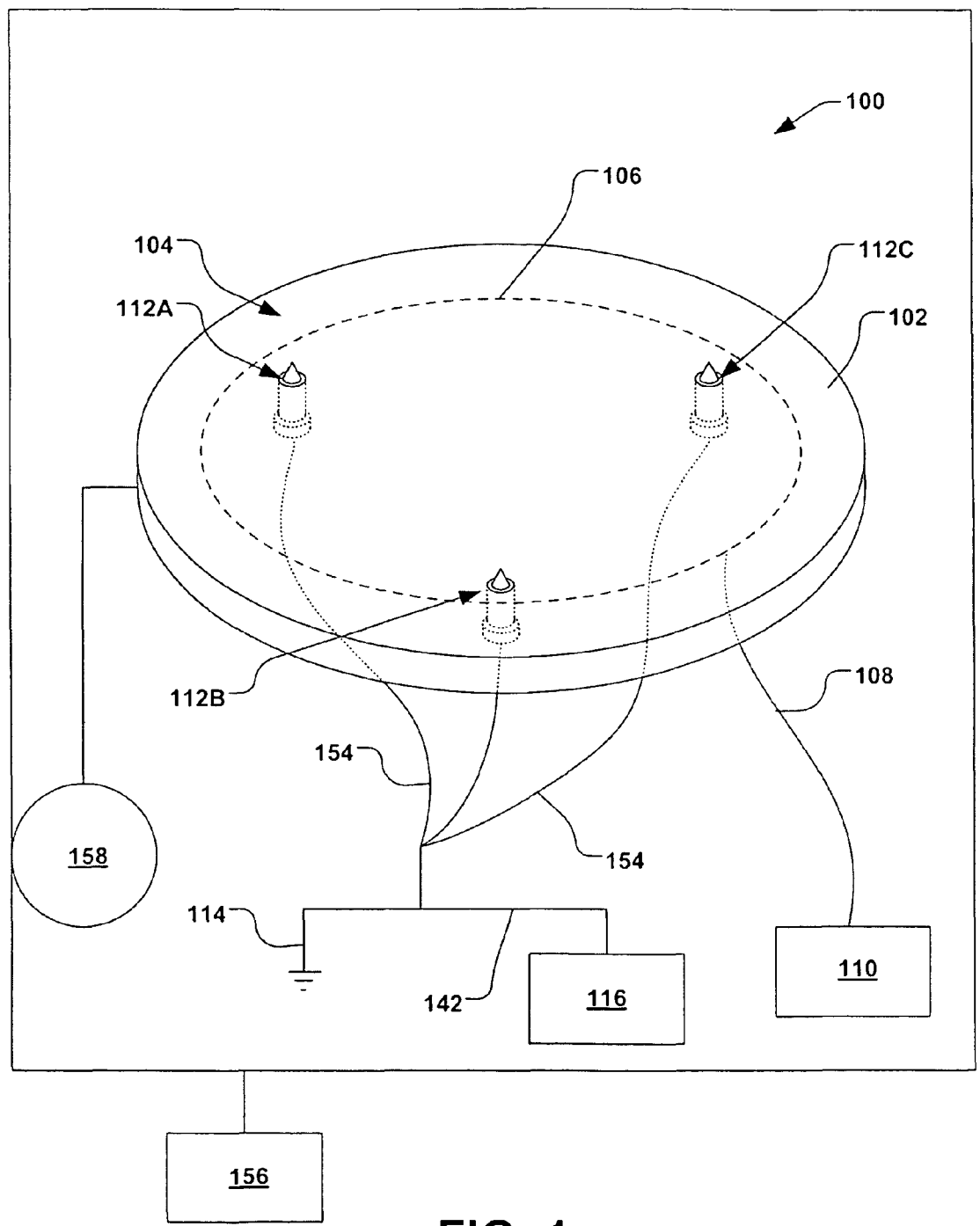
FIG. 1 is a perspective view of an exemplary electrostatic chuck according several aspects of the present invention.

The present invention is directed generally toward an electrostatic chuck (also called an electrostatic chuck or ESC) and method for clamping a workpiece, wherein an adequate electrical ground is provided between the electrostatic chuck and the workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exemplary electrostatic chuck (ESC) 100 in accordance with one aspect of the present invention. In one example, the electrostatic chuck 100 is a J-R type electrostatic chuck, however, other types of electrostatic chucks, such as coulombic electrostatic chucks, are also contemplated as falling within the scope of the present invention. The electrostatic chuck 100, for example, comprises a clamping plate 102 having a substantially planar clamping surface 104 defined thereon. One or more electrodes 106 are further associated with the clamping plate 102, wherein an electric potential 108 applied by a source 110 (e.g., an AC or DC power source) to the one or more electrodes is operable to selectively electrostatically clamp a workpiece (not shown) to the clamping surface 104 of the clamping plate, as will be understood by one of ordinary skill in the art.

In accordance with one exemplary aspect, an electrically conductive arc pin 112 is operably coupled to the clamping plate 102, wherein the arc pin is selectively electrically connected to an electrical ground 114 and an arc pin power source 116 (e.g., an AC or DC power source). FIG. 1 illustrates three arc pins 112A-112C, however, any number of arc pins can be implemented in accordance with the present invention. For example, the number of arc pins 112 can be selected to provide a uniform grounding across the workpiece (not shown). Each arc pin 112, as illustrated in further detail in FIG. 2, for example, comprises a tip 118. In one example, the tip 118 is configured to translate between an extended position 120 illustrated in FIG. 2 and a retracted position 122 illustrated in FIG. 3A. In the present example, the tip 118 is generally proud of the clamping surface 104 by a first distance 126 (e.g., between approximately 0.1 mm and 1 mm) when the arc pin 112 is in the extended position 120 of FIG. 2, and the tip is generally co-planar with to slightly proud of the clamping surface in the retracted position 122 of FIG. 3A. Thus, in the present example, the tip 118 of the arc pin 112 is configured to translate toward the clamping surface 104 upon a workpiece (not shown) being clamped to clamping plate 102. Alternatively, the extended and retracted positions of the arc pin 112 can be at various positions with respect to the clamping plate, as will be discussed further infra. In still another alternative, the arc pin 112 can be fixed with respect to the clamping plate 102, wherein the arc pin is generally co-planar to, or recessed from, the clamping surface 104.

Figure 2:
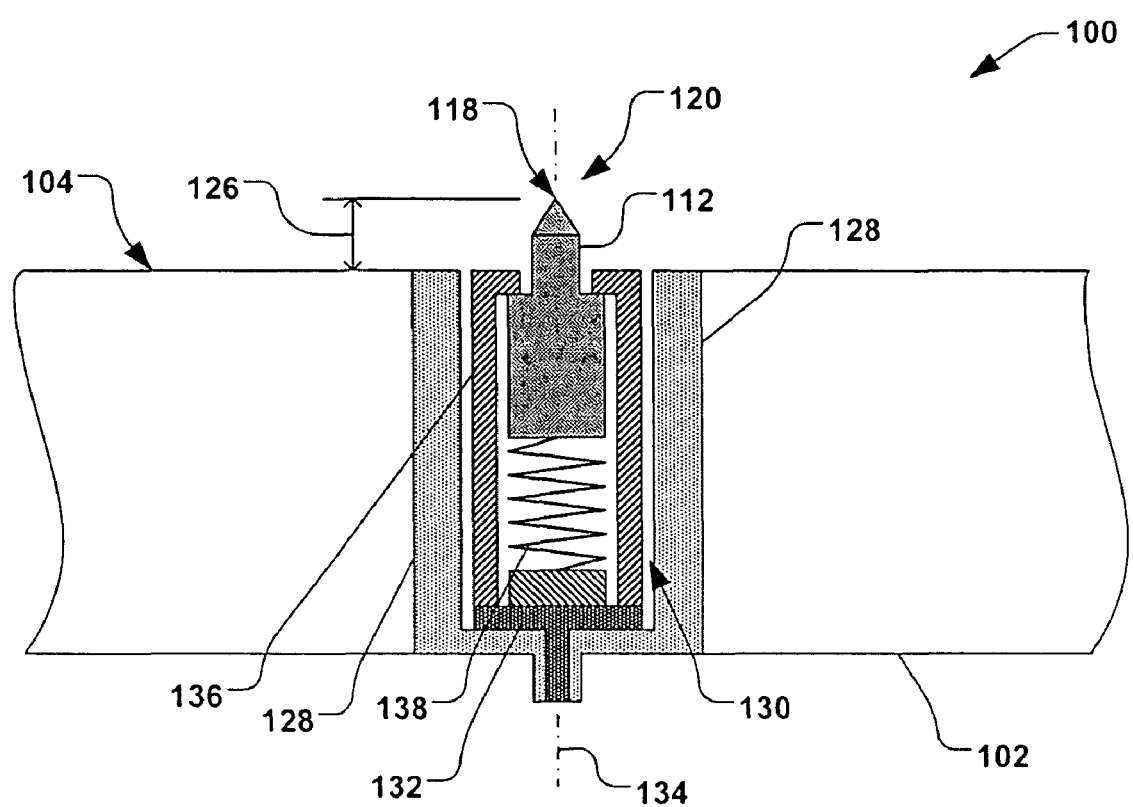
FIG. 2 illustrates a partial cross-sectional view of an exemplary arc pin for an ESC in accordance with one aspect of the invention.
Figure 3A:
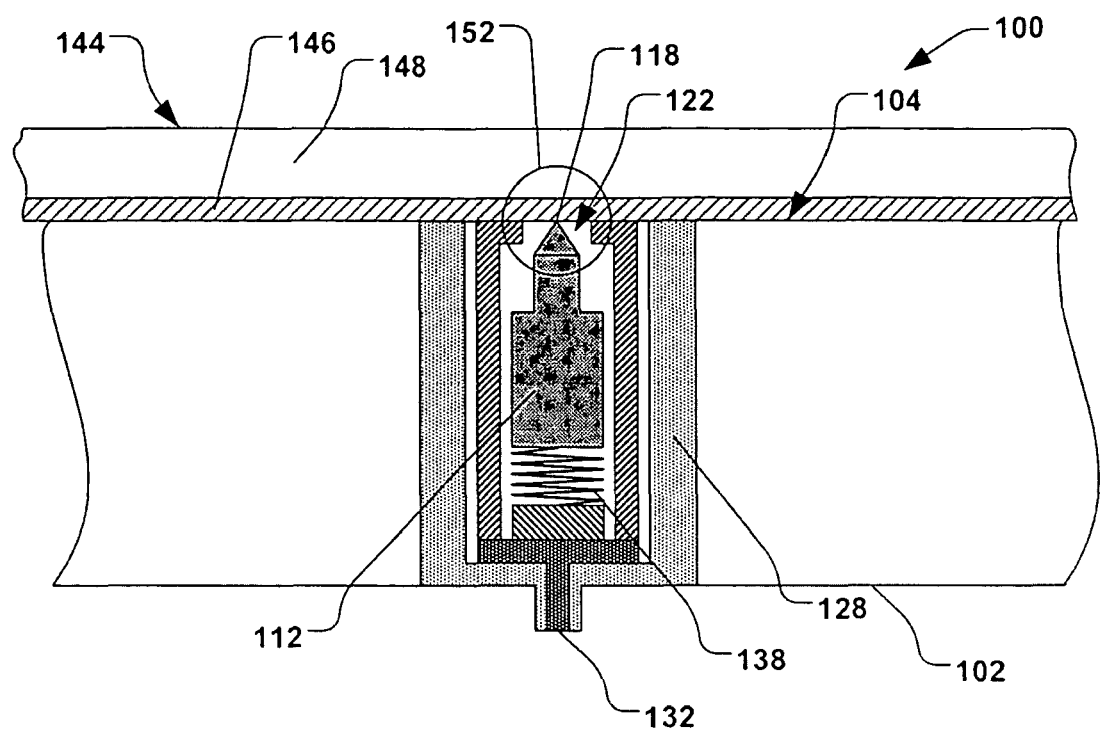
FIG. 3A illustrates a partial cross-sectional view of an exemplary arc pin coupled to an ESC in accordance with various aspects of the invention.
Figure 3B:
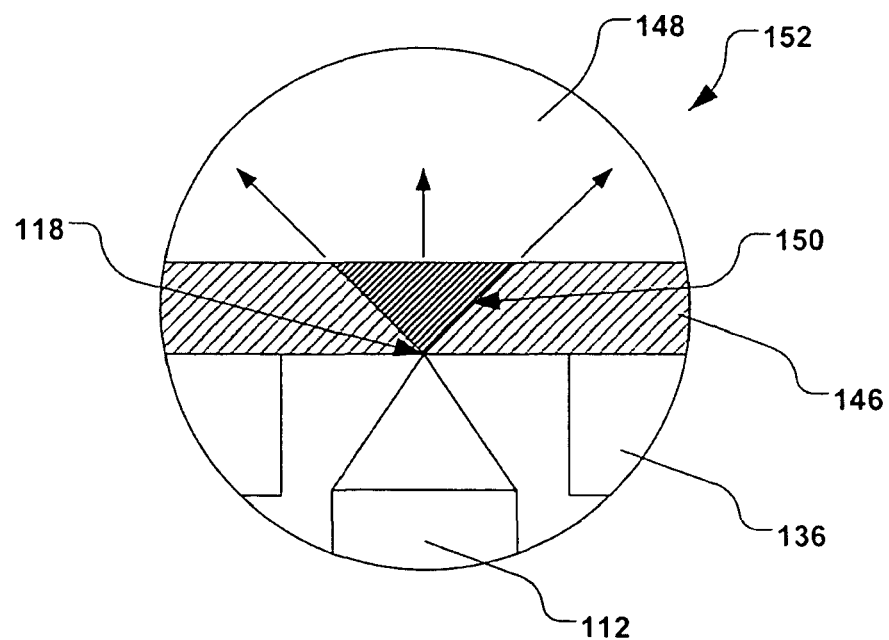
FIG. 3B illustrates a blown-up portion of the arc pin of FIG. 3A according to another exemplary aspect.

The electrostatic chuck 100 of FIGS. 2 and 3A-3B, for example, further comprises an electrically insulative housing 128 having a bore 130 extending therethrough, wherein the electrically insulative housing electrically insulates the arc pin from the clamping plate 102. At least a portion of the arc pin 112 generally resides within the bore 130 of the electrically insulative housing 128, wherein the arc pin is further electrically connected to an electrical contact 132 that penetrates the housing for further electrical connection thereto.

In the present example illustrated in FIGS. 2 and 3A-3B, the arc pin 112 is configured to linearly translate within the bore 130 along an axis 134 thereof. For example, an electrically conductive shell 136 generally resides within the bore 130 of the electrically insulative housing 128, wherein the arc pin 112 generally translates within the shell. According to the present example, a spring 138 is further provided, wherein the spring generally biases the arc pin 112 toward the clamping surface 104 from an end 140 of the electrically insulative housing 128. A spring constant of the spring 138, for example, is selected such that the arc pin 112 remains in contact with the workpiece when the workpiece is present on the clamping surface 104 of the clamping plate 102. A length and/or spring constant of the spring 138 is further selected such that the tip 118 of the arc pin is generally proud of the clamping surface 104 (e.g., between 0.1 mm and 1 mm) when the arc pin 112 is in the extended position. The arc pin 112, for example, is comprised of a substantially hard material such as tungsten or boron carbide, wherein the tip of the arc pin can be repeatedly used while incurring little wear or dulling thereof.

Accordingly, as will be discussed hereafter, a sufficient arc pin voltage 142 supplied from the arc pin power source 116 of FIG. 1, when applied to the arc pin 112, is operable to provide an electrical ground to the workpiece 144 of FIGS. 3A and 3B. For example, the workpiece 144 of FIGS. 3A and 3B comprises an electrically insulative layer 146 (e.g., an oxide layer, nitride layer, or other electrically insulative layer) that was previously formed over a semiconductor substrate 148, wherein the arc pin voltage 142 generally arcs through the electrically insulative layer to the semiconductor substrate of the workpiece 144. As illustrated in the blown up portion 152, it is believed that the local arcing through the electrically insulating layer 146 to the semiconductor substrate 148 generally removes and/or thermally fractures the electrically insulating layer in the vicinity of the arcing (e.g., referred to as a grounding region 150). Thus, as the electrically insulating layer 146 is removed from the grounding region 150, the tip 118 of arc pin 112 is generally permitted to contact the underlying semiconductor substrate 148, therein providing an electrical connection thereto.

For example, a wire 154 or other electrical conductor is electrically connected to each arc pin 112 of FIG. 1, wherein each wire can be further selectively electrically connected to the electrical ground 114. A controller 1 56 may be further provided, wherein the controller is configured to control one or more of the arc pin power source and the electrostatic clamping power source, wherein a control of the arc pin power source can be selectively control the arc pin voltage 142, and further selectively electrically ground the arc pin(s) 112. It should be noted that in the present example illustrated in FIG. 1, each of the arc pins 112A, 112B, and 112C is electrically connected to a common arc pin power source 116. Alternatively, a plurality of power sources 116 are provided, wherein one or more of the arc pins 112 are electrically connected to each of the plurality of power sources. For example, each arc pin 112 can be driven with an independent waveform from the respective arc pin power source 116. Accordingly, when a plurality of power sources 116 are utilized, the one or more of the arc pins 112 are electrically isolated from the remaining arc pins and the clamping plate 102.

According to another aspect of the invention, a gas source 158 is provided, wherein the gas source is configured to provide a gas (not shown) between the tip 118 of the arc pin 112 and the workpiece 144. The gas provided from the gas source 158, for example, comprises an inert gas such as nitrogen. Further, with the introduction of such a gas, the tip 118 of the arc pin 112 can be kept generally stationary and generally planar to, or recessed from, the clamping surface 104, wherein the spring 138 can be omitted. A Paschen curve can implemented to determine appropriate arc pin voltage, position of the tip 118 of the arc pin 112, and gas pressure for acceptable arcing, as will be understood by one of ordinary skill in the art.

Alternatively, in another example, a translation mechanism (not shown) is operably coupled to the arc pin 112, wherein the translation mechanism is configured to selectively translate the arc pin between the retracted position 122 and the extended position 120. The retracted position 122, for example, is generally recessed from the clamping surface 104, and the extended position is generally planar to, or proud of, the clamping surface. Thus, the controller 156 of FIG. 1 is further configured to control the electrostatic clamping power source 110, arc pin power source 116, and translation mechanism (not shown), wherein the control of the translation of the arc pin 112 is based, at least in part, on the arc pin voltage 142 from the arc pin power source. For example, the arc pin voltage 142 is applied to the arc pin 112 when the arc pin is in the retracted position 122, and arcing occurs between arc pin 112 and the workpiece 144 of FIG. 3A through the gas. Once the electrically insulative layer 146 is substantially removed from the grounding region 150, the arc pin 112 is translated toward the workpiece 144 of FIG. 3A, wherein the tip 118 of the arc pin generally contacts the semiconductor substrate 148 for electrical grounding thereto. It should be noted that a lower arc pin voltage may be provided after contacting the tip 118 of the arc pin 112 to the semiconductor substrate 148 in order to maintain the electrical conduction between the arc pin and the workpiece 144.

Figure 4:
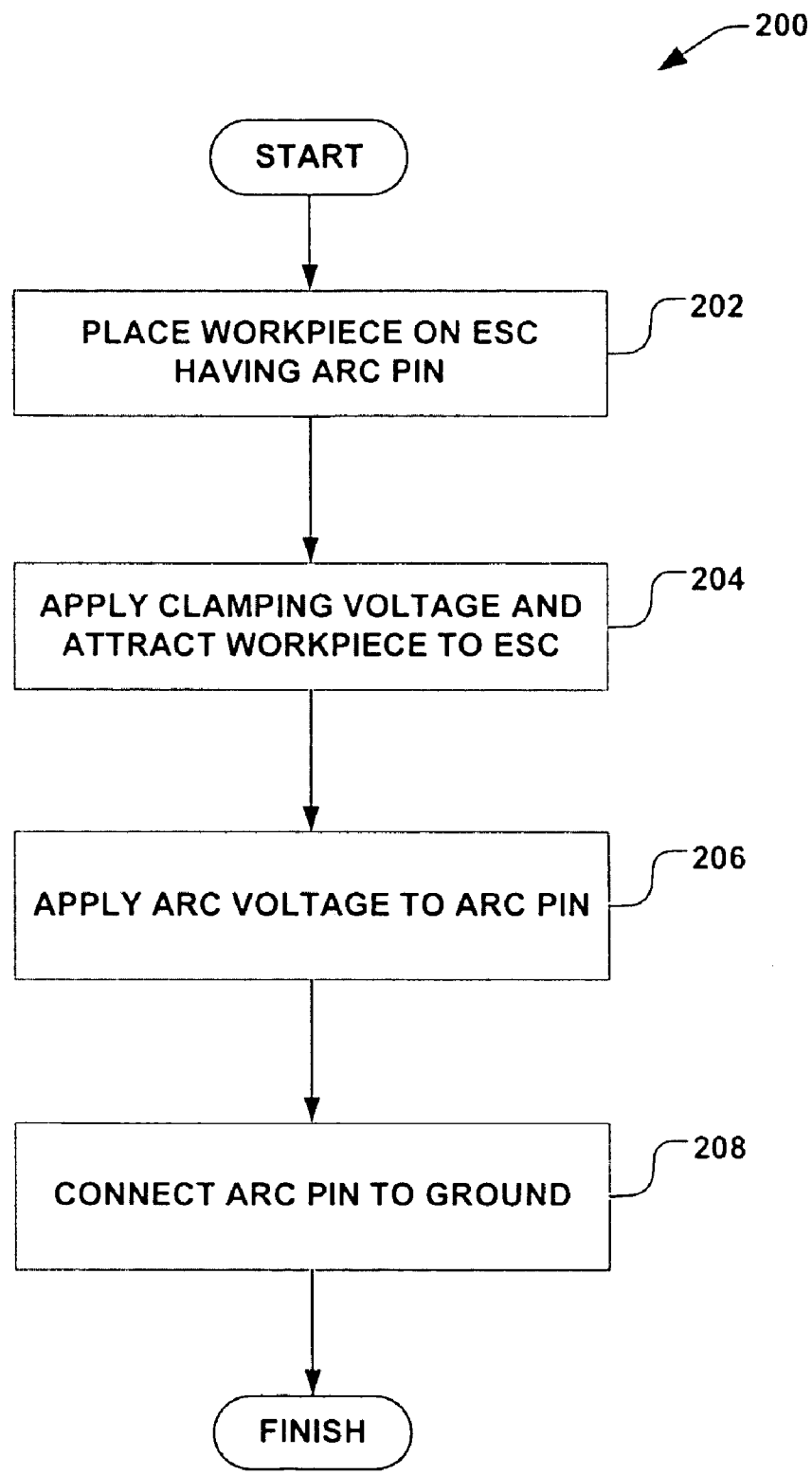
FIG. 4 illustrates an exemplary method for grounding an electrostatically clamped workpiece in accordance with a further exemplary aspect of the present invention.

In accordance with another exemplary aspect of the invention, FIG. 4 illustrates an exemplary method 200 for grounding a workpiece for electrostatic clamping of the workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 4 begins at act 202, wherein a workpiece having electrically insulative layer formed thereover is placed on a clamping surface of an electrostatic chuck having one or more arc pins. For example, the workpiece 144 is placed on the clamping surface 104 of the clamping plate 102 of FIG. 3A, wherein the tip 118 of the arc pin 112 contacts the workpiece 144. It should be noted that while act 202 is described as placing the workpiece on the clamping surface, the workpiece does not necessarily contact the clamping surface 104, but rather, may generally contacts only the punch tip(s) 112. Alternatively, as described above, the workpiece 144 can be placed on the clamping surface 104 wherein the tip 118 of the arc pin 112 does not contact the workpiece, and wherein a gas is provided between the arc pin and the workpiece.

In act 204 of FIG. 4, a clamping voltage is applied to one or more electrodes, wherein the workpiece is electrostatically attracted to the clamping surface. The attraction of the workpiece 144 of FIG. 3A, for example, thus linearly translates the tip 118 of the arc pin 112 toward the clamping surface 104, as illustrated in FIG. 3B. For example, the electrostatic force between the workpiece 144 and clamping plate 102 generally overcomes the force from the spring 138. The clamping voltage may be a DC voltage or an AC voltage.

In act 206 of FIG. 4, as further illustrated in FIG. 3B, an arc pin voltage is applied to the arc pin, wherein a grounding region of the electrically insulative layer is generally removed by an arcing of the arc pin voltage between the arc pin and the workpiece. The arc pin voltage, for example, comprises a square wave AC waveform, wherein the square wave AC waveform has a higher frequency than the clamping voltage. Experimentation has shown that a higher frequency waveform (e.g. upwards of 100 Hz) and/or a higher amplitude waveform (e.g., upwards of 800 VAC) tends to produce greater penetration through electrically insulative layers, however, the desired frequency and amplitude of the waveform can vary, based on the thickness of the electrically insulative layer. For an electrically insulative layer of approximately 2,000 angstroms, a 100 VAC waveform at 100 Hz is generally found to be sufficient, without introducing a great amount of particulate contamination.

Thus, in act 208 of FIG. 4, an electrical return path from the workpiece through the arc pin is provided, wherein the arc pin generally electrically contacts the semiconductor substrate, and wherein the arc pin is further electrically grounded. For example, the spring 138 of FIG. 3A generally forces the arc pin 112 toward the semiconductor substrate 148 as the electrically insulative layer 146 is removed, and the arc pin voltage is switched to ground. Alternatively, the tip 118 of the arc pin 112 is translated toward the workpiece 144 during and/or after the removal of the electrically insulative layer 146 in the grounding region 150 of FIG. 3B via the translation mechanism described above.

According to another example, the arc pin voltage is lowered to a maintenance level once the electrical connection to the semiconductor substrate is attained, wherein the electrical return path is maintained by arcing caused by the lowered arc pin voltage. By reducing the arc pin voltage to a maintenance level (e.g., approximately 20% power), particulate formation and contamination can be minimized, therein maintaining the electrical connection to the workpiece 144, while minimizing deleterious effects associated with particles.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic chuck, comprising:
    an electrostatic clamping power source;
    a clamping plate having a clamping surface configured to accept a workpiece for electrostatic clamping thereon, the clamping plate comprising one or more electrodes, wherein the one or more electrodes are electrically connected to the electrostatic clamping power source, and wherein a hole extends through the clamping plate from the clamping surface to a backside of the clamping plate;
    a workpiece grounding apparatus, comprising:
        an electrically insulative housing positioned within the hole in the clamping plate, wherein the electrically insulative housing is generally hollow and comprises an open end facing the clamping surface and an opposite closed end, therein defining a bore in the electrically insulative housing;
        an electrically conductive shell positioned within the bore of the electrically insulative housing, wherein the electrically conductive shell is generally hollow and comprises a radial lip associated with the clamping surface, and wherein the electrically conductive shell is electrically insulated from the clamping plate by the electrically insulative housing;
        a spring positioned within the electrically conductive shell; and
        an arc pin having a tip associated with the clamping surface and a barrel portion, wherein the arc pin is biased toward the clamping surface via the spring, and wherein the barrel portion of the arc pin is slidingly confined within the electrically conductive shell via the radial lip of the electrically conductive shell; and
    an arc pin power source selectively electrically connected to the arc pin via the electrically conductive shell.

2. The electrostatic chuck of claim 1, wherein the arc pin is configured to linearly translate between an extended position and a retracted position within the bore of the electrically insulative housing based, at least in part, on a position of the workpiece with respect to the clamping surface of the clamping plate.

3. The electrostatic chuck of claim 2, wherein the tip of the arc pin is proud of the clamping surface by less than approximately 0.5 mm when the arc pin is in the extended position.

4. The electrostatic chuck of claim 2, wherein the tip of the arc pin is recessed from the clamping surface in the extended position.

5. The electrostatic chuck of claim 1, wherein the spring has a spring constant ranging between 90 gm/mm and 110 gm/mm.

6. The electrostatic chuck of claim 1, further comprising a controller configured to control the electrostatic clamping power source and arc pin power source.

7. The electrostatic chuck of claim 1, further comprising a gas source configured to provide a gas between the tip of the arc pin and the workpiece, and wherein the controller is further configured to control the gas source.

8. The electrostatic chuck of claim 1, wherein the arc pin power source comprises an AC power source configured to provide a square wave arc pin voltage to the arc pin.

9. The electrostatic chuck of claim 1, wherein a voltage differential between the electrostatic clamping power source and arc pin power source is greater than approximately 800 Volts.

10. The electrostatic chuck of claim 1, further comprising an electrical ground, wherein the arc pin is alternatingly connected to one of the electrical ground and the arc pin power source.

11. The electrostatic chuck of claim 1, wherein the tip is comprised of boron carbide.

12. The electrostatic chuck of claim 1, comprising a plurality of workpiece grounding apparatuses selectively electrically connected to the arc pin power source.

* * * * *